United States Patent
Isobayashi et al.

(10) Patent No.: US 9,865,547 B2
(45) Date of Patent: Jan. 9, 2018

(54) SEMICONDUCTOR DEVICE AND MANUFACTURING METHOD THEREOF

(71) Applicant: KABUSHIKI KAISHA TOSHIBA, Minato-ku, Tokyo (JP)

(72) Inventors: Atsunobu Isobayashi, Yokkaichi Mie (JP); Akihiro Kajita, Yokkaichi Mie (JP); Tadashi Sakai, Yokohama Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/068,506

(22) Filed: Mar. 11, 2016

(65) Prior Publication Data
US 2017/0062346 A1   Mar. 2, 2017

(30) Foreign Application Priority Data
Aug. 26, 2015 (JP) ................ 2015-166690

(51) Int. Cl.
*H01L 23/532* (2006.01)
*H01L 21/768* (2006.01)
*H01L 23/522* (2006.01)

(52) U.S. Cl.
CPC .. *H01L 23/53276* (2013.01); *H01L 21/76885* (2013.01); *H01L 21/76886* (2013.01); *H01L 21/76834* (2013.01); *H01L 23/5226* (2013.01)

(58) Field of Classification Search
CPC ....... H01L 2924/0002; H01L 23/53276; H01L 29/1606; H01L 21/3215; B82Y 30/00; B82Y 40/00
USPC .......................... 438/610, 495; 977/734, 842
See application file for complete search history.

(56) References Cited

U.S. PATENT DOCUMENTS

| | | | |
|---|---|---|---|
| 2013/0099205 A1* | 4/2013 | Liu ................. | H01L 31/035236 257/28 |
| 2014/0162464 A1* | 6/2014 | Dimitrakopoulos | ..................... H01L 23/5329 438/761 |
| 2014/0231751 A1 | 8/2014 | Wada et al. | |
| 2014/0284798 A1 | 9/2014 | Miyazaki et al. | |
| 2014/0319685 A1* | 10/2014 | Bao ................... | H01L 23/53276 257/751 |
| 2015/0061133 A1 | 3/2015 | Isobayashi et al. | |
| 2015/0137377 A1* | 5/2015 | Bao .................... | H01L 23/5226 257/758 |

FOREIGN PATENT DOCUMENTS

JP    2015061042 A    3/2015

OTHER PUBLICATIONS

Azad Naeemi, et al., "Conductance Modeling for Graphene Nanoribbon (GNR) Interconnects", IEEE Electron Device Letters, vol. 28, No. 5, May 2007, pp. 428-431.

(Continued)

*Primary Examiner* — David Vu
*Assistant Examiner* — Jonathan Han
(74) *Attorney, Agent, or Firm* — Holtz, Holtz & Volek PC

(57) ABSTRACT

According to one embodiment, a semiconductor device is disclosed. The device includes a graphene layer containing impurities, and including a first region and a second region. The second region has a resistance higher than a resistance of the first region. The second region includes a side surface of an end of the graphene layer. The device further includes a first plug being in contact with the first region.

14 Claims, 16 Drawing Sheets

(56) References Cited

OTHER PUBLICATIONS

Azad Naeemi, et al., "Performance Benchmarking for Graphene Nanoribbon, Carbon Nanotube, and Cu Interconnects", Interconnect Technology Conference, Jun. 1-4, 2008, pp. 183-185.
Chuan Xu, et al., "Graphene Nano-Ribbon (GNR) Interconnects: A Genuine Contender or a Delusive Dream?", Electron Devices Meeting, Dec. 15-17, 2008, pp. 201-204.

\* cited by examiner

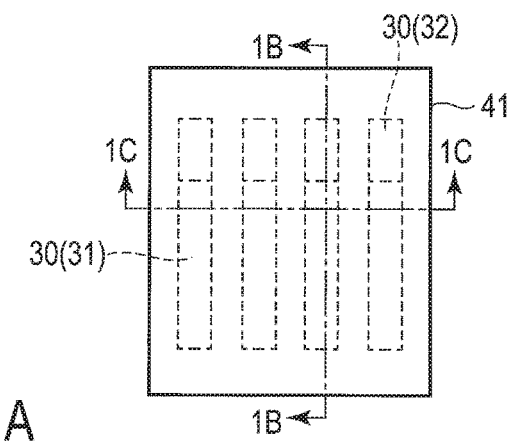
F I G. 1A
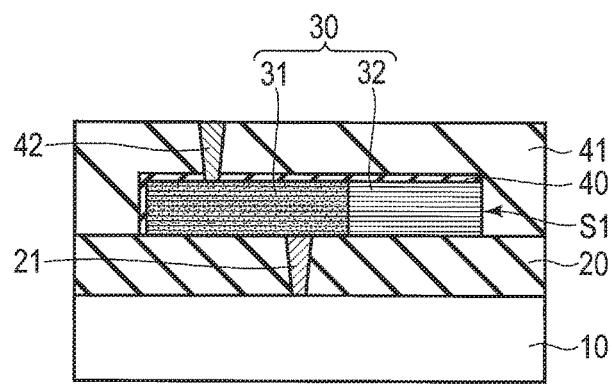
F I G. 1B
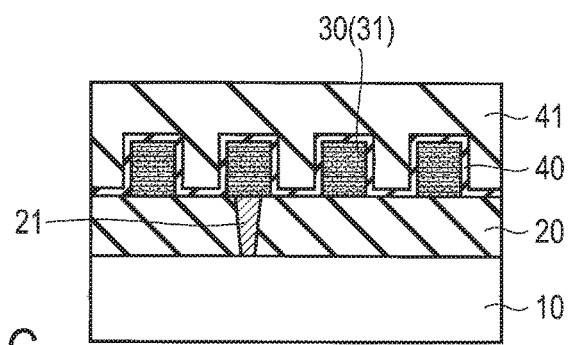
F I G. 1C

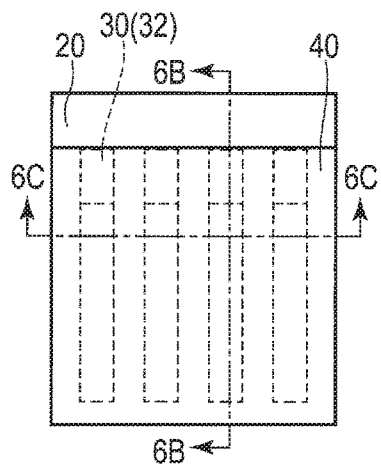
F I G. 6A
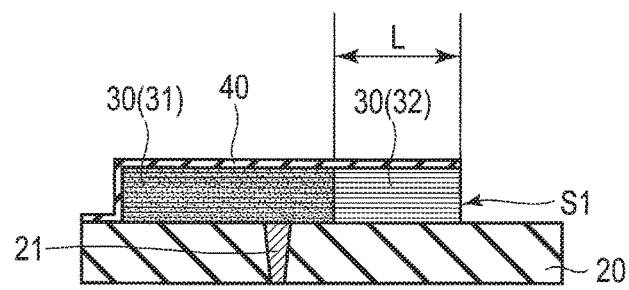
F I G. 6B
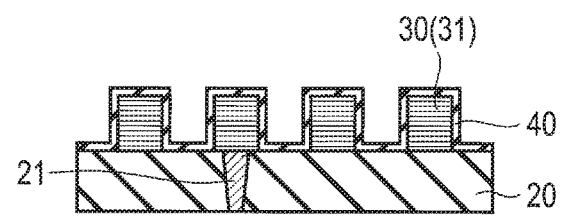
F I G. 6C

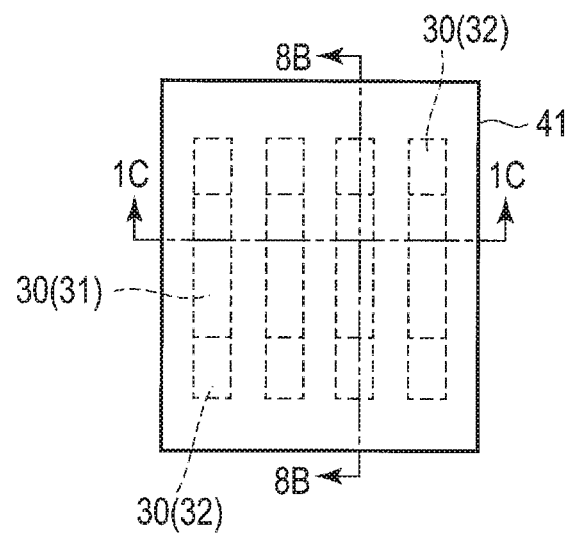
F I G. 8A
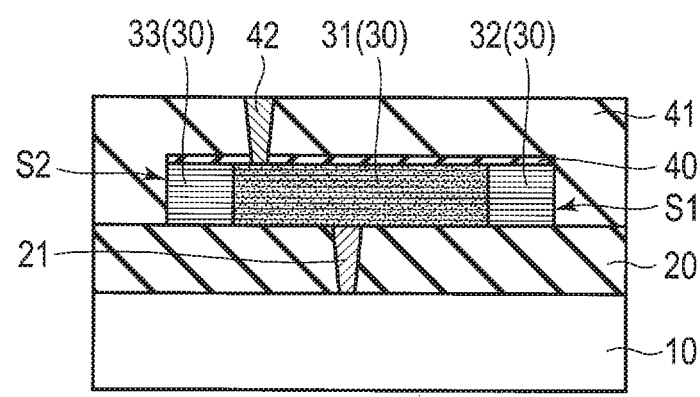
F I G. 8B

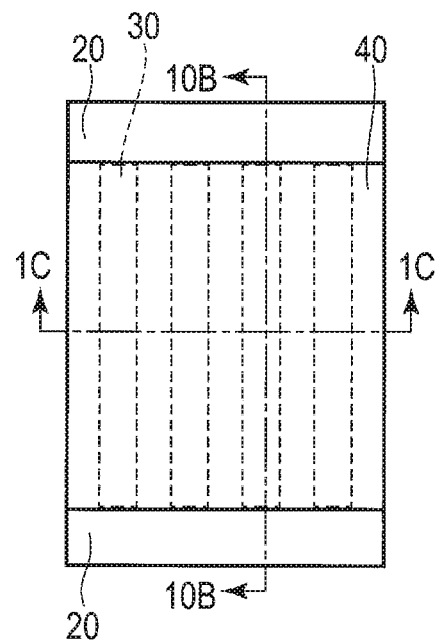
F I G. 10A
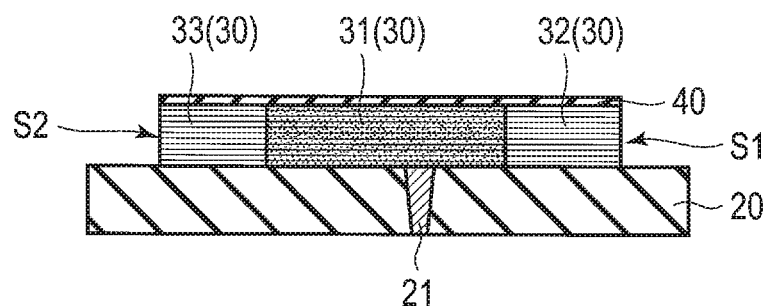
F I G. 10B

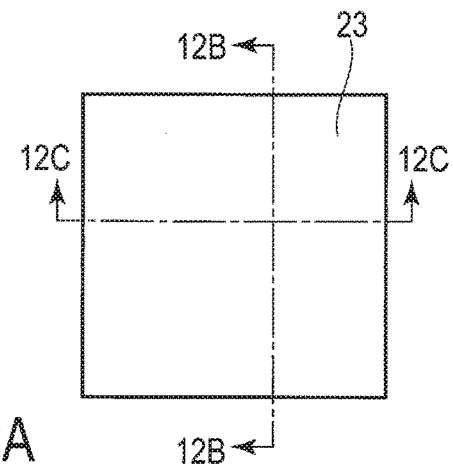
F I G. 12A
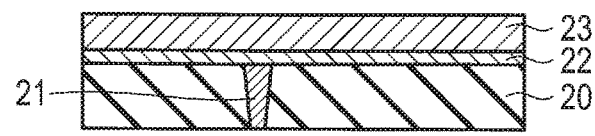
F I G. 12B
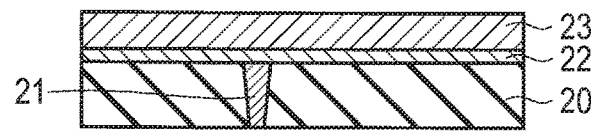
F I G. 12C

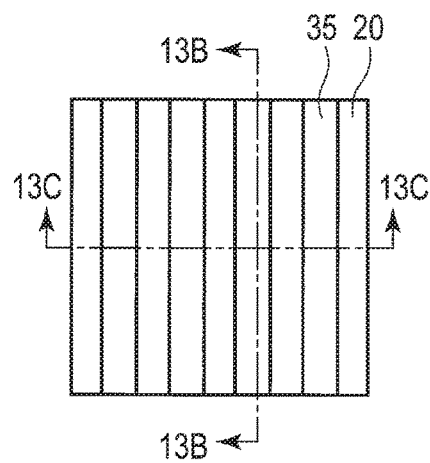
F I G. 13A
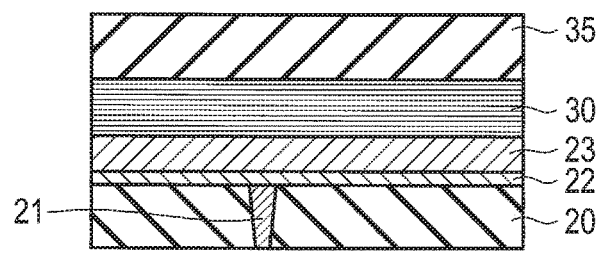
F I G. 13B
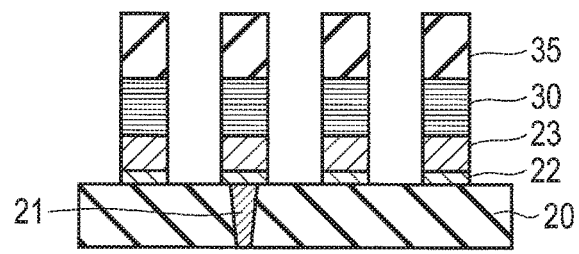
F I G. 13C

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2015-166690, filed Aug. 26, 2015, the entire contents of which are incorporated herein by reference.

FIELD

Embodiments described herein relate generally to a semiconductor device including a graphene layer, and a manufacturing method thereof.

BACKGROUND

In recent years, the miniaturization of an interconnect has advanced in an LSI interconnect structure, which arises a problem such as an increasing of electric resistivity caused by interfacial inelastic scattering of electrons, an increasing of current density, or a reliability degradation by stress migration or electromigration. Copper, a low-resistance metal, is mainly used as an interconnect material for LSI, however the problem still arises with the advance of microfabrication of the interconnect structure.

Then, it is examined to use graphene as the interconnect material for LSI. It is well known that quantized conductance (what is called. Ballistic conductance) is generated in the graphene, and the graphene is expected to be an extremely low resistance material as an alternative to the existing metallic materials.

BRIEF DESCRIPTION OF THE DRAWINGS

FIG. 1A is a plan view illustrating a semiconductor device according to a first embodiment.

FIG. 1B is a cross-sectional view taken along line 1B-1B of FIG. 1A.

FIG. 1C is a cross-sectional view taken along line 1C-1C of FIG. 1A.

FIG. 6A is a plan view for explaining the method of manufacturing the semiconductor device according to the first embodiment subsequent to FIG. 5A.

FIG. 6B is a cross-sectional view taken along line 6B-6B of FIG. 6A.

FIG. 6C is a cross-sectional view taken along line 6C-6C of FIG. 6A.

FIG. 8A is a plan view illustrating a semiconductor device according to a second embodiment.

FIG. 8B is a cross-sectional view taken along line 8B-8B of FIG. 8A.

FIG. 10A is a plan view for explaining the method of manufacturing the semiconductor device according to the second embodiment subsequent to FIG. 9A.

FIG. 10B is a cross-sectional view taken along line 10B-10B of FIG. 10A.

FIG. 12A is a plan view for explaining a method of manufacturing the semiconductor device according to the third embodiment.

FIG. 12B is a cross-sectional view taken along line 12B-1B of FIG. 12A.

FIG. 12C is a cross-sectional view taken along line 12C-12C of FIG. 12A.

FIG. 13A is a plan view shown for explaining the method of manufacturing the semiconductor device according to the third embodiment subsequent to FIG. 12A.

FIG. 13B is a cross-sectional view taken along line 13B-13B of FIG. 13A.

FIG. 13C is a cross-sectional view taken along line 13C-13C of FIG. 13A.

DETAILED DESCRIPTION

Figure 2A:
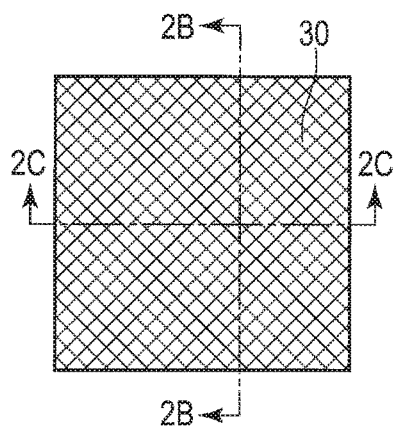
FIG. 2A is a plan view for explaining a method of manufacturing the semiconductor device according to the first embodiment.

In general, according to one embodiment, a semiconductor device is disclosed. The device includes a graphene layer containing impurities, and including a first region and a second region. The second region has a resistance higher than a resistance of the first region. The second region includes a side surface of an end of the graphene layer. The device further includes a first plug being in contact with the first region.

In general, according to another embodiment, a method of manufacturing a semiconductor device is disclosed. The method includes forming a first plug; forming a graphene layer being in contact with the first plug; forming a film covering an upper surface and a side surface of the graphene layer. The method further includes exposing a side surface of an end of the graphene layer by etching the film and the graphene layer; and forming a first region and a second region having a resistance higher than a resistance of the first region in the graphene layer by introducing impurities into the graphene layer through the exposed side surface. The first plug is in contact with the first region.

Hereafter, embodiments of the present invention will be described, referring to the drawings, which illustrate typical or conceptual examples. Dimensions, ratios, etc. of each drawing are not necessarily the same as those of an actual embodiment. Moreover, in any of the drawings, the same symbols indicate the same or corresponding portions. Explanation will be repetitiously given if needed.

First Embodiment

FIG. 1A is a plan view illustrating a semiconductor device according to a first embodiment. FIG. 1B and FIG. 1C show cross-sectional views taken along lines 1B-1B and 1C-1C of FIG. 1A, respectively.

In FIG. 1B and FIG. 1C, 10 denotes a substrate, and an interlayer insulating film 20 is provided on the substrate 10. The substrate 10 includes, for example, a semiconductor substrate such as a silicon substrate. Elements such as MOS transistors or capacitors are formed on the semiconductor substrate.

A contact plug (a first plug) 21 connected to the substrate 10 is provided in the interlayer insulating film 20. The lower surface of the first plug 21 is connected to, for example, the source region or the drain region of the MOS transistor (not shown) or an interconnect (not shown) in the substrate 10.

A plurality of linear graphene layers 30 constituting interconnects are provided on the interlayer insulating film 20. Each graphene layer 30 contains impurities. The interconnects are, for example, interconnects in a memory or a logic circuit. FIG. 1A and FIG. 1C illustrate four graphene layers 30. However, the number of graphene layers 30 is not limited to four. Further, the shape of each graphene layer 30 is not limited to the linear shape.

It is noted that graphene includes at least one of a single-layer graphene and a stacked layer of single-layer graphenes (stacked graphene) in the present specification. In addition, a graphene layer is a layer including graphene.

As shown in FIG. 1A and FIG. 1B, the graphene layer 30 includes a first region 31 and a second region 32. The first region 31 is adjacent to the second region 32. As shown in FIG. 1B, the second region 32 includes a side surface S1 of one end of the graphene layer 30.

The second region 32 has a resistance higher than that of the first region 31. An impurity concentration of the second region 32 is lower than that in the first region 31.

As shown in FIG. 1B and FIG. 1C, the first plug 21 is disposed under the first region 31 of the graphene layer 30. An upper surface of the first plug 21 is in contact with a lower surface of the first region 31. That is, the upper surface of the first plug 21 is in contact with the first region 31 where is a low resistance region of the lower surface of the graphene layer 30. More specifically, the upper surface of the first plug 21 is in contact with the first region 31 without being in contact with the second region 32 having a high resistance. Thus, increase in contact resistance between the first plug 21 and the graphene layer 30 is effectively prevented. In the present embodiment, the upper surface of the first plug 21 is directly in contact with the lower surface of the first region 31.

As shown in FIG. 1B and FIG. 1C, a passivation film (a first film) 40 is provided on the upper surface and the side surface of the graphene layer 30. As shown in FIG. 1B, the passivation film 40 covers the graphene layer 30 such that the side surface S1 of the one end of the graphene layer 30 is exposed.

An interlayer insulating film (a second film) 41 is provided on the passivation film 40. As shown in FIG. 1B, the interlayer insulating film 41 covers the side surface S1 of the one end of the graphene layer 30.

As shown in FIG. 1B, a via plug (a second plug) 42 connected to the graphene layer 30 is provided in the interlayer insulating film 41 and the passivation film 40. The second plug 42 is disposed on the upper surface of the first region 31.

The lower surface of the second plug 42 is in contact with the upper surface of the first region 31. That is, the lower surface of the second plug 42 is in contact with the first region 31 where is a low resistance region of the upper surface of the graphene layer 30. More specifically, the lower surface of the second plug 42 is in contact with the upper surface of the first region 31 without being in contact with the second region 32 having a high resistance. Thus, increase in contact resistance between the second plug 42 and the graphene layer 30 is effectively prevented. In the present embodiment, the second plug 42 is directly in contact with the first region 31.

Now, the semiconductor device of the present embodiment will be further explained hereinafter in accordance with a manufacturing method thereof.

Figure 2B:
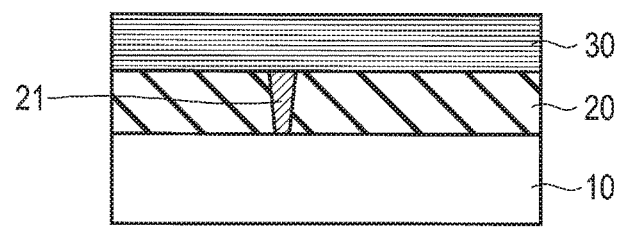
FIG. 2B is a cross-sectional view taken along line 2B-2B of FIG. 2A.
Figure 2C:
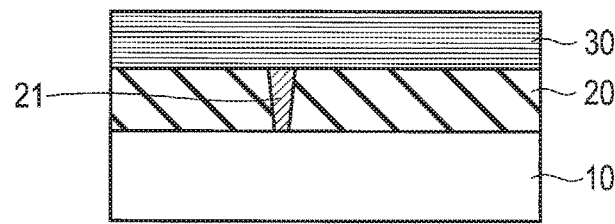
FIG. 2C is a cross-sectional view taken along line 2C-2C of FIG. 2A.

[FIG. 2A, FIG. 2B and FIG. 2C]

The interlayer insulating film 20 is formed on the substrate 10. Subsequently, the first plug 21 is formed. The first plug 21 penetrates the interlayer insulating film 20 and is connected to the substrate 10.

The interlayer insulating film 20 is, for example, a silicon dioxide film or a silicon nitride film.

A process for forming the first plug 21 includes, for example, forming a connection hole (not shown) which reaches the surface of the substrate 10 in the interlayer insulating film 20 by using photolithography process and etching process, forming a conductive film on the interlayer insulating film 20 in order to fill the connection hole, and removing the conductive film outside the connection hole and planarizing the surface by chemical mechanical polishing (CMP) process.

Subsequently, the graphene layer 30 is formed on the interlayer insulating film 20 and the first plug 21. The graphene layer 30 is formed by, for example, low temperature CVD process using a source gas including carbons. It is noted that the substrate 10 is omitted in the following figures.

Figure 3A:
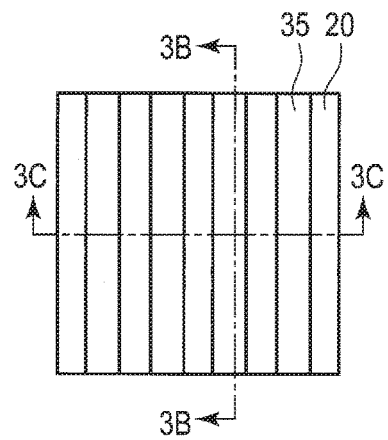
FIG. 3A is a plan view for explaining the method of manufacturing the semiconductor device according to the first embodiment subsequent to FIG. 2A.
Figure 3B:
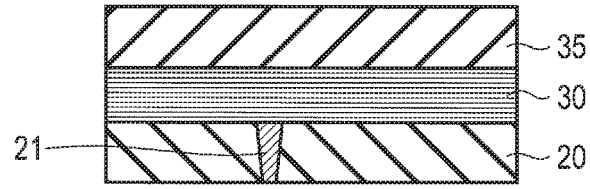
FIG. 3B is a cross-sectional view taken along line 3B-3B of FIG. 3A.
Figure 3C:
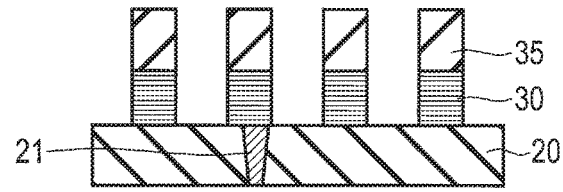
FIG. 3C is a cross-sectional view taken along line 3C-3C of FIG. 3A.

[FIG. 3A, FIG. 3B and FIG. 3C]

A hard mask 35 is formed on the graphene layer 30. The hard mask 35 has a pattern corresponding to the interconnect (graphene interconnect) to be formed. A thickness of the hard mask 35 is, for example, less than or equal to 100 nm.

A process for forming the hard mask 35 includes, for example, forming a film of single-layer or multi-layer containing at least one of oxide, nitride and metal, and processing the film by using photolithography process and etching process. The oxide is for example $SiO_2$, the nitride is for example $Si_3N_4$, and the metal is W. In addition, the film is formed by using, for example, CVD process or PVD process.

The graphene layer 30 is processed by etching using the hard mask 35 as a mask, thereby dividing the graphene layer 30 into a plurality of linear layers. In the explanation below, each of the linear layers is also mentioned as the graphene layer 30.

Figure 4A:
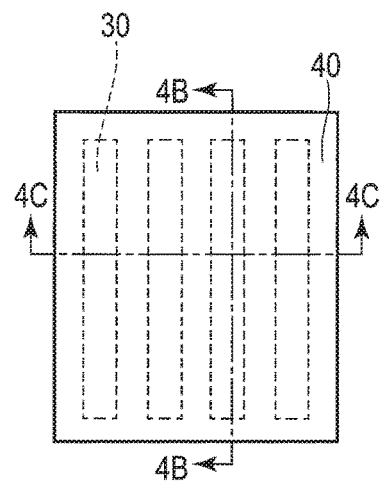
FIG. 4A is a plan view for explaining the method of manufacturing the semiconductor device according to the first embodiment subsequent to FIG. 3A.
Figure 4B:
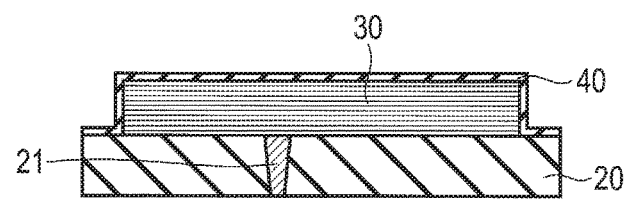
FIG. 4B is a cross-sectional view taken along line 4B-4B of FIG. 4A.
Figure 4C:
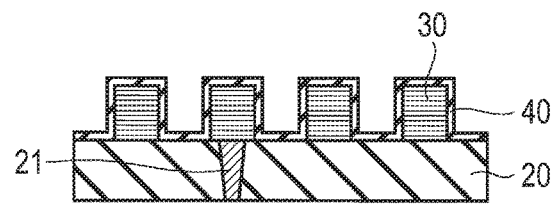
FIG. 4C is a cross-sectional view taken along line 4C-4C of FIG. 4A.

[FIG. 4A, FIG. 4B and FIG. 4C]

The hard mask 35 shown in FIG. 3A to FIG. 3C is removed. Subsequently, the interlayer insulating film. 20 and the graphene layer 30 are cleaned by using wet process.

The passivation film 40 is formed on the interlayer insulating film 20 and the graphene layer 30. The passivation film 40 covers the upper surface and the side surfaces of the graphene layer 30. The passivation film 40 contains, for example, a nitride such as a silicon nitride or a titanium nitride. The passivation film 40 is formed by, for example, ALD process or CVD process.

Figure 5A:
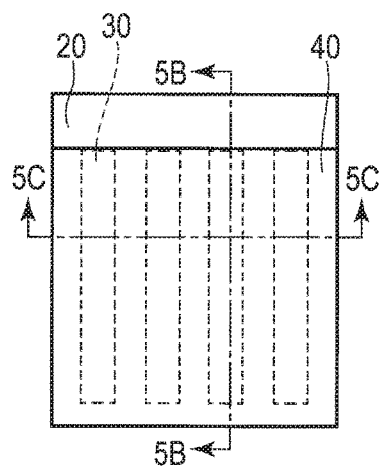
FIG. 5A is a plan view for explaining the method of manufacturing the semiconductor device according to the first embodiment subsequent to FIG. 4A.
Figure 5B:
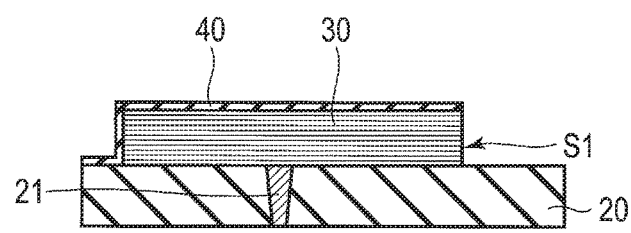
FIG. 5B is a cross-sectional view taken along line 5B-5B of FIG. 5A.
Figure 5C:
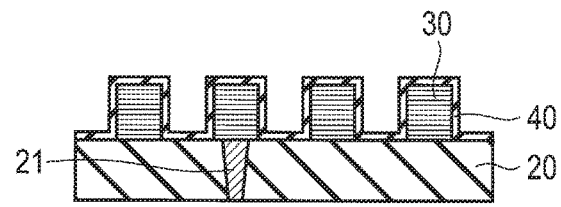
FIG. 5C is a cross-sectional view taken along line 5C-5C of FIG. 5A.

[FIG. 5A, FIG. 5B and FIG. 5C]

The side surface S1 of the one end of the graphene layer 30 is exposed by etching the passivation film 40 and graphene layer 30 using a resist pattern (not shown) as a mask.

The passivation film. 40 covers the side surfaces except the side surface S1 of the graphene layer 30, and the upper surface of the graphene layer 30. The interlayer insulating film 20 and the plug 21 cover the lower surface of the graphene layer 30. Thus, the surface of the graphene layer 30 except the side surface S1 is not exposed excluding side surface S1.

Thereafter, the interlayer insulating film 20, the graphene layer 30 and the passivation film. 40 are cleaned by wet process.

[FIG. 6A, FIG. 6B and FIG. 6C]

The first region 31 and the second region 32 are formed in the graphene layer 30 by introducing impurities into the graphene layer 30 through the exposed side surface S1 of the graphene 30.

A method for introducing the impurities into the graphene layer is, for example, a method using vaporized impurities heated in a range form 100° C. to 700° C. (intercalation), or a method using liquid impurities. In addition, when ionic impurities are used, the impurities can be introduced into the graphene layer 30 by applying a voltage to the graphene layer 30.

The impurities to be introduced into the graphene layer 30 include, for example, at least one of Li, Na, K, Cs, Ca, Sr, Ba, Sm, Eu, Yb, Tm, $F_2$, $Br_2$, ICl, IBr, $MgCl_2$, $AlCl_3$, $FeCl_3$, $CuCl_2$, $SbCl_5$, $MoCl_5$, $AsF_5$, $SbF_5$, $NbF_5$, $HNO_3$, $H_2SO_4$, $H_3PO_4$ and HF. Among these substances, Li, Na, K, Cs, Ca, Sr, Ba, Sm, Eu, Yb and Tm are donor-type impurities, and the reset substances are acceptor-type impurities.

In the present embodiment, the length L of the second region 32 is greater than or equal to a certain value (for example, 10 μm). In other words, in the present embodiment, the length L is a distance from the one end of the graphene layer 30 on the side surface S1 side to the first region 31. The first region 31 is longer than the second region 32. The length of the first region 31 is, for example, in a rage from a few 100 μm to a few mm.

Figure 7A:
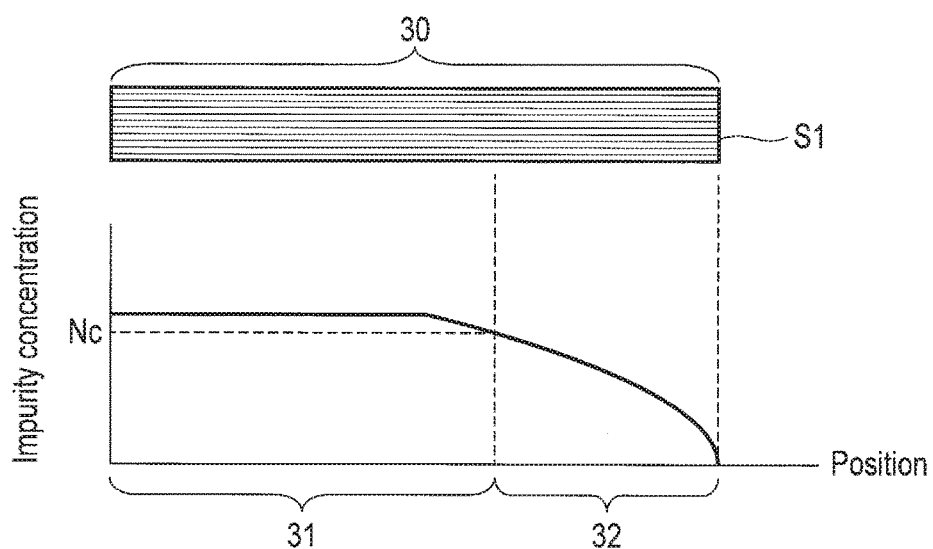
FIG. 7A is a view schematically illustrating a distribution of impurity concentrations of first and second regions of a graphene layer along a longitudinal direction thereof.

FIG. 7A a view schematically illustrating a distribution of impurity concentrations (doping concentration [$cm^{-3}$]) of the first region 31 and the second region 32 of the graphene layer 30 in a longitudinal direction thereof.

FIG. 7A shows that the impurity concentration of the second region 32 is lower than the impurity concentration of the first region 31. The impurity concentration of the second region 32 increases from side surface S1 toward the first region 31.

The distribution of the impurity concentration of the first region 31 has the minimum impurity concentration greater than or equal to a certain value (Nc). In a case of the present embodiment, the distribution of the impurity concentration of the first region 31 has the maximum impurity concentration greater than the certain value (Nc). In the distribution of the impurity concentration of the first region 31, both the minimum value and the maximum value may be the certain value (Nc). On the other hand, the distribution of impurity concentration of the second region 32 has the minimum impurity concentration less than the certain value (Nc).

That is, the impurity concentration of the second region 32 is lower than the impurity concentration of the first region 31, and the impurity concentration of the second region 32 increases from side surface S1 toward the first region 31. In other words, the first region 31 is a region (a high concentration region) in which the impurity concentration is greater than or equal to Nc in the entire part. The second region 32 is a region (a low concentration region) in which the impurity concentration is less than Nc in substantially the entire part.

The following reason can be considered for the acquisition of the graphene layer 30 having the distribution of the impurity concentration shown in FIG. 7A.

The side surface S1 of the graphene layer 30 is a surface (an inlet) for introducing impurities into the graphene layer 30, and is also a surface (an outlet) for discharging the impurities introduced into the graphene layer 30. Thus, the impurities in a region of which the distance from the side surface S1 is less than a constant value (a region with an unstable impurity concentration), are easily discharged through the side surface S1, and as for the impurities in the region, the closer the region to the side surface S1, the more easily the impurities is discharged through side surface S1. In contrast, the impurities in a region of which the distance from the side surface S1 is greater than or equal to the certain value (a region with a stable impurity concentration), are difficult to be discharged through side surface S1.

The region with the stable impurity concentration (high concentrations region) and the region with the unstable impurity concentration (low concentration region) are different in a resistance value defined by sheet resistance, resistivity or the like. The difference in the resistance can be measured by using, for example, a nanoprober. In addition, the two regions can be distinguished by evaluating a degree of incursion of the impurities between the graphene layers at macro level by Raman spectroscopic analysis or the like.

According to the research by the present inventors, it is found out that the distance L is not less than about 10 μm. Therefore, in the present embodiment, the distance L is ≥10 μm.

The first region 31 and the second region 32 are a high concentration region (in other words, a low resistance region) and a low concentration region (in other words, a high resistance region), respectively, and the first plug 21 is in contact with the first region 31 without being in contact with the second region. Thus, as described above, according to the present embodiment, the increase in contact resistance between the first plug 21 and the graphene layer 30 is effectively prevented.

Figure 7B:
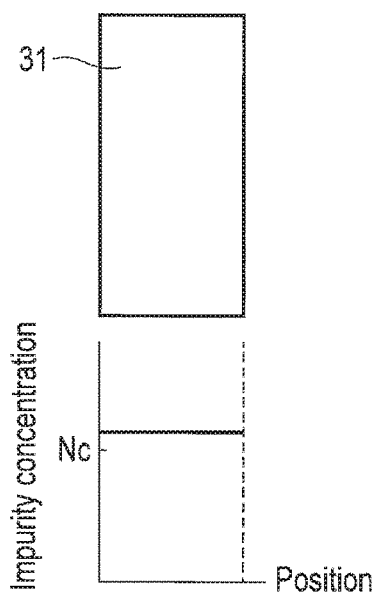
FIG. 7B is a view schematically illustrating a distribution of impurity concentration of the first region of the graphene layer in a width direction thereof.

FIG. 7B is a vies schematically illustrating a distribution of the impurity concentration of the first region 31 of the graphene layer 30 in a width direction. The impurity concentration of the first region 31 in the width direction is nearly constant value that is greater than or equal to the certain value (Nc).

Figure 7C:
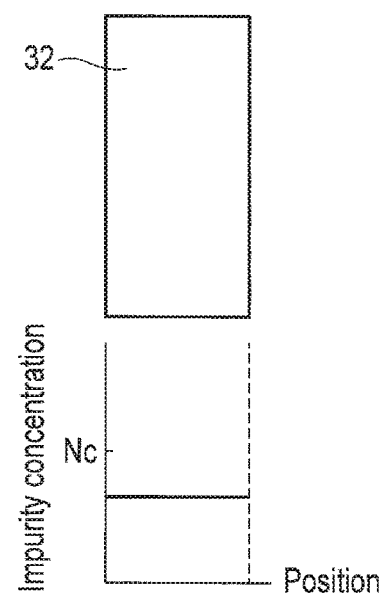
FIG. 7C is a view schematically illustrating a distribution of impurity concentrations of the second region of the graphene layer in a width direction thereof.

FIG. 7C is a view schematically illustrating a distribution of the impurity concentration of the second region 32 of the graphene layer 30 in a width direction. The impurity concentration of the second region 32 in the width direction is nearly constant value that is less than the certain value (Nc). In general, the impurity concentration of the second region 32 in the width direction decreases toward side surface S1.

The distributions of the impurity concentrations shown in FIG. 7A, FIG. 7B and FIG. 7C are confirmed in a plurality of graphene layers 30 (30, 31).

After the steps of FIG. 6A to FIG. 6C, the interlayer insulating film 41 is formed on the interlayer insulating film 20 and the passivation film. 40 such that the side surface S1 is covered by the interlayer insulating film 41. The interlayer insulating film 41 contains an oxide or a nitride. The interlayer insulating film 41 is formed by using, for example, CVD process, PVD process or ALD process. Subsequently, a connection hole reaching the first region 31 is formed in the interlayer insulating film 41 and the passivation film 40, then the second plug 42 is formed in the connection hole, thereby obtaining the semiconductor device shown in FIG. 1A to FIG. 1C.

The second plug 42 is in contact with the first region 31 (the high concentration region or the low resistance region) without being in contact with the second region 32 (the low concentration region or the high resistance region), so that the increase in contact resistance between the second plug 42 and the graphene layer 30 is effectively prevented.

Second Embodiment

FIG. 8A is a plan view illustrating a semiconductor device according to a second embodiment. FIG. 8B is a cross-sectional view taken along line 8B-8B of FIG. 8A.

The present embodiment is different from the first embodiment in that a graphene layer 30 further includes a third region 33. The third region 33 is adjacent to a first region 31 and includes a side surface S2 of the other end of the graphene layer 30. As well as a second region 32, the third region 33 has a resistance higher than that of the first region 31. In addition, as well as the impurity concentration of the second region 32, the impurity concentration of the third region 33 is lower than that of the first region 31.

The semiconductor device of the present embodiment will be further explained hereinafter according to its manufacturing method.

First, the steps of from FIG. 2A-FIG. 2C to FIG. 4A-FIG. 4C is performed as in the first embodiment.

Figure 9A:
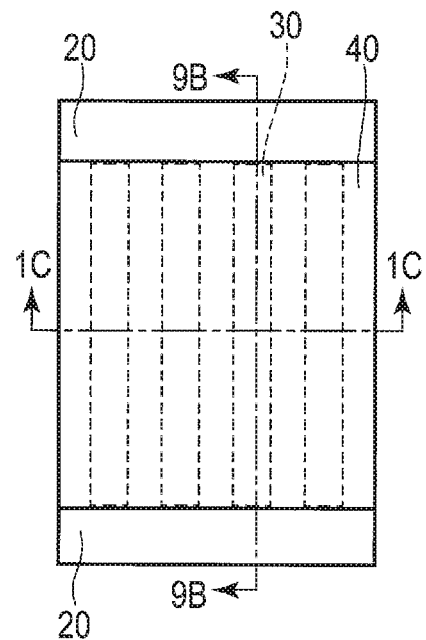
FIG. 9A is a plan view for explaining a method of manufacturing the semiconductor device according to the second embodiment.
Figure 9B:
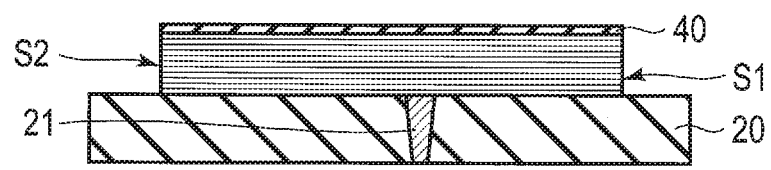
FIG. 9B is a cross-sectional view taken along line 9B-9B of FIG. 9A.

[FIG. 9A and FIG. 9B]

The side surface S1 of an end of the graphene layer 30 and the side surface S2 of other end of the graphene layer 30 are exposed by etching the passivation film 40 and the grapheme layer 30 using a resist pattern (not shown) as a mask.

The passivation film 40 covers the side surfaces of the graphene layer 30 other than the side surfaces S1 and S2, and the upper surface of the graphene layer 30, and an interlayer insulating film 20 and a plug 21 cover the lower surface of the graphene layer 30. Thus, the surface of the graphene layer 30 is not exposed excluding the side surfaces S1 and S2.

Subsequently, the interlayer insulating film 20, the graphene layer 30 and the passivation film 40 are rinsed by wet process.

[FIG. 10A and FIG. 10B]

The first region 31, the second region 32 and the third region are formed in the graphene layer 30 by introducing the impurities into the graphene layer 30 through the exposed side surfaces S1 and S2 of the graphene layer 30.

In the present embodiment, the impurities are introduced into the graphene layer 30 through two side surfaces S1 and S2, and amount of the impurities introduced into the graphene layer 30 per unit time is increased, so that the first region 31, which is the high impurity concentration, can be formed in shorter time.

Subsequently, an interlayer insulating film 41 is formed on the interlayer insulating film 20 and the passivation film 40 such that the interlayer insulating film. 41 covers the side surfaces S1 and S2, then a connection hole reaching the first region is formed in the interlayer insulating film. 20 and the passivation film 40, and the second plug 42 is formed in the connection hole, thereby obtaining the semiconductor device shown in FIG. 8A and FIG. 8B.

Third Embodiment

Figure 11A:
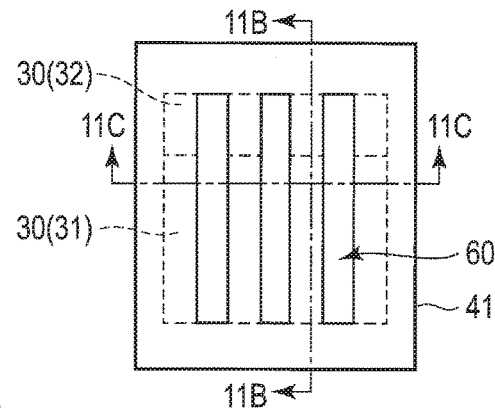
FIG. 11A is a plan view illustrating a semiconductor device according to a third embodiment.
Figure 11B:
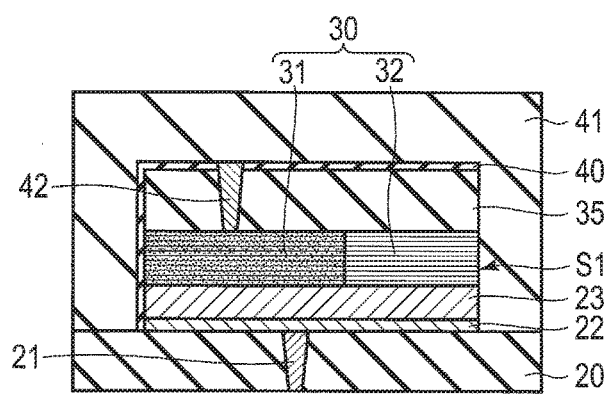
FIG. 11B is a cross-sectional view taken along line 11B-11B of FIG. 11A.
Figure 11C:
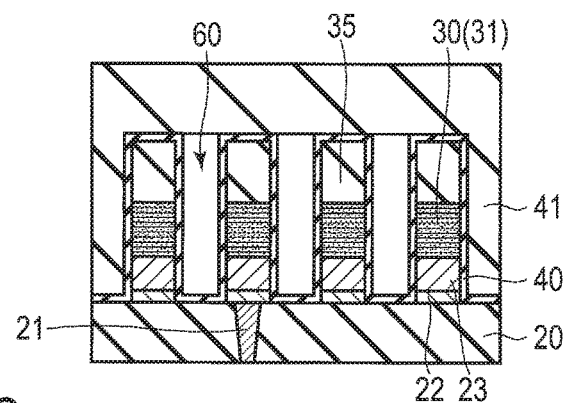
FIG. 11C is a cross-sectional view taken along line 11C-11C of FIG. 11A.

FIG. 11A is a plan view illustrating a semiconductor device according to a third embodiment. FIG. 11B and FIG. 11C show cross-sectional views taken along lines 11B-11B and 11C-11C of FIG. 11A, respectively.

The present embodiment is different from the first embodiment in that the present embodiment further comprises a catalyst underlayer 22 and a catalyst layer 23 provided under the graphene layer 30, and a hard mask 35 provide on the graphene layer 30. That is, the multilayer structure including the catalyst underlayer 22, the catalyst layer 23, the graphene layer 30 and the hard mask 35 is used as an interconnect structure. In addition, air gap 60 is provided between the adjacent two multilayer interconnect structures.

The semiconductor device of the present embodiment will be further explained hereinafter according to its manufacturing method.

[FIG. 12A, FIG. 12B and FIG. 12C]

An interlayer insulating film 20 is formed on a substrate (not shown). Subsequently, a first plug 21 is formed, which penetrates through the interlayer insulating film 20 and is connected to the substrate.

The catalytic underlayer 22 is formed on the interlayer insulating film. 20 and the first plug 21. The material of the catalytic underlayer 22 is, for example, Ta, Ti, Ru, W, Al, a nitride of these elements or an oxide of these elements. The catalytic underlayer 22 has a thickness of, for example, 50 nm or less. The catalytic underlayer 22 may be omitted.

The catalytic layer 23 is formed on the catalytic underlayer 22. The catalytic layer 23 is connected to the first plug 21 via the catalytic underlayer 22. The material of the catalytic layer 23 is, for example, Co, Ni, Fe, Cu, Ru, an alloy of these elements or a carbide of these elements. The catalytic layer 23 has a thickness of, for example, 100 nm or less.

[FIG. 13A, FIG. 13B and FIG. 13C]

The graphene layer 30 is formed on the catalytic layer 23, then the hard mask 35 is formed on the graphene layer 30, and the stacked body of the graphene layer 30, the catalytic layer 23 and the catalytic underlayer 22 is processed by using the hard mask 35 as a mask, thereby dividing the stacked body into a plurality of linear stacked bodies.

Figure 14A:
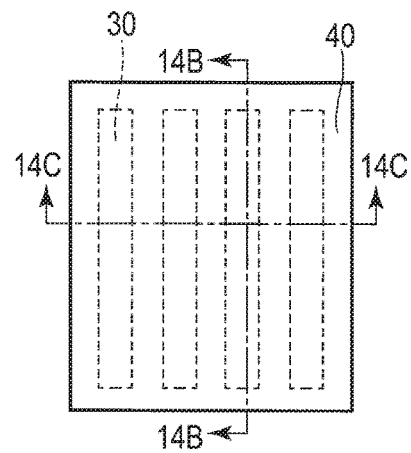
FIG. 14A is a plan view for explaining the method of manufacturing the semiconductor device according to the third embodiment subsequent to FIG. 13A.
Figure 14B:
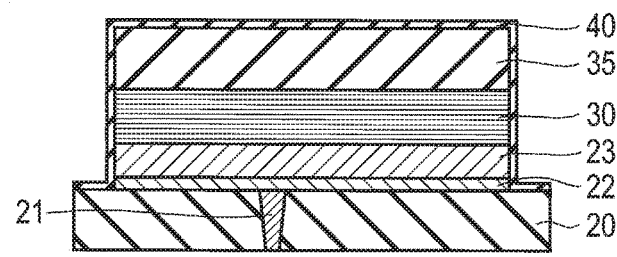
FIG. 14B is a cross-sectional view taken along line 14B-14B of FIG. 14A.
Figure 14C:
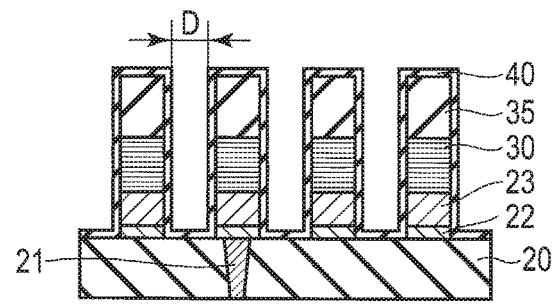
FIG. 14C is a cross-sectional view taken along line 14C-14C of FIG. 14A.

[FIG. 14A, FIG. 14B and FIG. 14C]

A passivation film 40 is formed on the interlayer insulating film 20, the catalytic underlayer 22, the catalytic layer 23, the graphene layer 30 and the hard mask 35. The passivation film 40 covers the side surfaces of the catalytic underlayer 22, the catalytic layer 23 and the graphene layer 30, and the side surfaces and the upper surface of the hard mask 35.

In the present embodiment, the distance D between interconnect structures covered by the passivation film 40 is set to 30 nm or less, preferably, 10 nm or less, such that the air gap between two adjacent graphene layers 30 after an interlayer insulating film 41 is formed. If the distance D is less than or equal to a certain value, a source gas is not sufficiently supplied in a space between the interconnect structures, and the space is not filled with the interlayer insulating film 41. The distance D can be controlled by the distance between the interconnect structures and the thickness of the passivation film 40.

Figure 15A:
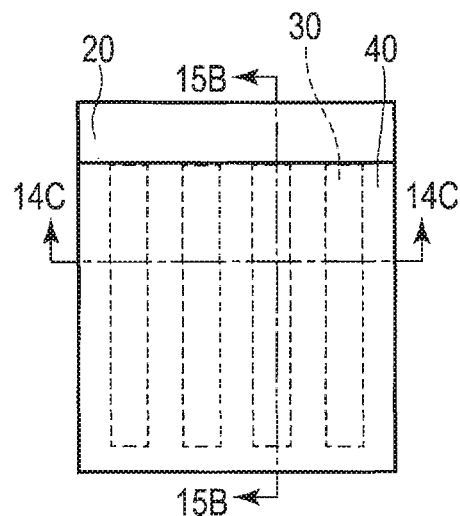
FIG. 15A is a plan view for explaining the method of manufacturing the semiconductor device according to the third embodiment subsequent to FIG. 14A.
Figure 15B:
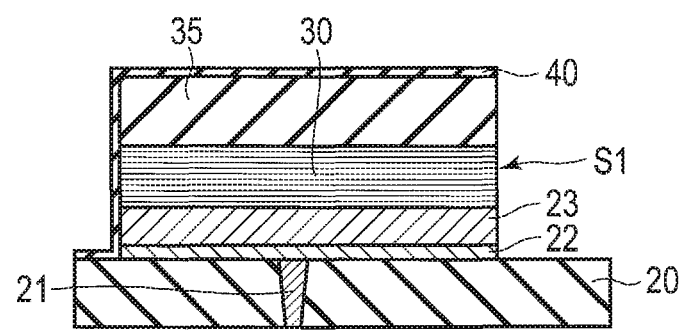
FIG. 15B is a cross-sectional view taken along line 15B-15B of FIG. 15A.

[FIG. 15A and FIG. 15B]

The side surface S1 of the end of the graphene layer 30 is exposed by etching the passivation film 40, the hard mask 35, the graphene layer 30, the catalyst layer 23 and catalyst underlayer 22 using a resist pattern (not shown) as a mask. In the present embodiment, the side surfaces of the end of the hard mask 35, the catalyst layer 23 and the catalyst underlayer 22 are also exposed.

Figure 16A:
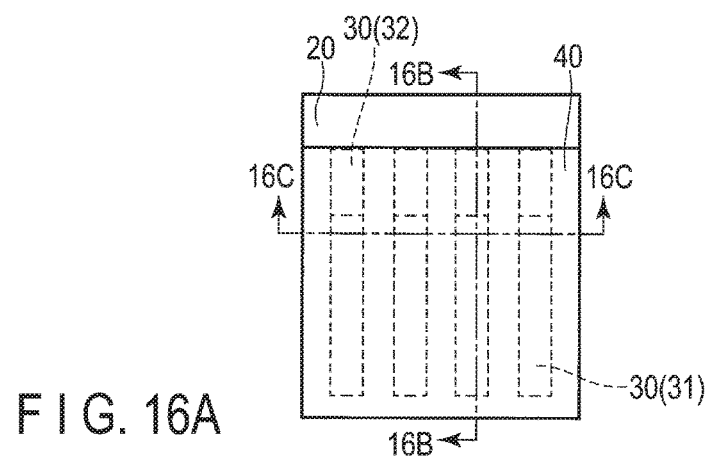
FIG. 16A is a plan view for explaining the method of manufacturing the semiconductor device according to the third embodiment subsequent to FIG. 15A.
Figure 16B:
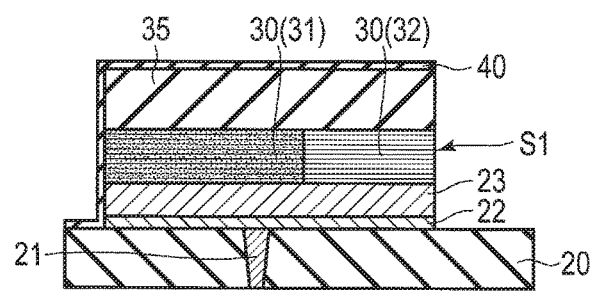
FIG. 16B is a cross-sectional view taken along line 16B-16B of FIG. 16A.
Figure 16C:
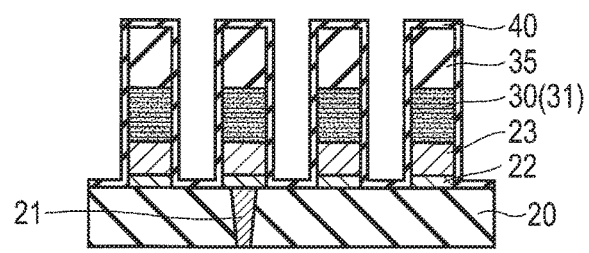
FIG. 16C is a cross-sectional view taken along line 16C-16C of FIG. 16A.

[FIG. 16A, FIG. 16B and FIG. 16C]

The first region 31 and the second region 32 are formed in the graphene layer 30 by introducing the impurities into the graphene layer 30 through the exposed surface S1 of the graphene layer 30. In the present embodiment, the first plug 21 is indirectly in contact with the first region 31 via the catalytic underlayer 22 and the catalytic layer 23.

Subsequently, the interlayer insulating film 41 and the air gap 60 are formed, subsequently, a connection hole reaching the first region 31 is formed in the interlayer insulating film 41 and the passivation film 40, and the second plug 42 is formed in the connection hole, thereby obtaining the semiconductor device shown in FIG. 11A to FIG. 11B.

It is noted that the interlayer insulating film may be formed between adjacent two hard masks 35. Because the effect of the air gap is to reduce capacitance between the interconnect structures (graphene layers).

In addition, the interlayer insulating film 41 may be formed in a manner to fill the interconnect structures as in the first embodiment. In this case, it is better to remove the hard mask 35 than to leave the hard mask 35. Because an aspect ratio between the interconnect structures is reduced, and adequate source gas is easily supplied between the interconnect structures.

In addition, the graphene layer 30 may further include the third region 33 as in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate comprising a surface;
a graphene layer provided on the surface of the substrate, the graphene layer containing impurities, and including a first region and a second region, the first region being adjacent to the second region, the first region and the second region not overlapping when viewed from above the surface of the substrate, the second region having a resistance higher than a resistance of the first region, and the second region including a side surface of the graphene layer;
a first plug being in contact with the first region;
a first film covering the graphene layer but exposing said side surface of the graphene layer; and
a second film covering said side surface of the graphene layer,
wherein a concentration of the impurities in the first region is greater than or equal to a certain value, and the second region includes a region in which a concentration of the impurities is lower than the certain value, and
wherein the concentration of the impurities in the second region increases in a direction from said side surface of the graphene layer toward the first region.

2. The device of claim 1, wherein the first film contains a nitride, and the second film contains one of an oxide and a nitride.

3. The device of claim 1, further comprising a second plug which is in contact with the graphene layer, wherein one of the first plug and the second plug is in contact with a lower surface of the first region, and the other one of the first plug and the second plug is in contact with an upper surface of the first region.

4. The device of claim 3, wherein the first plug and the second plug are in contact with the first region without being in contact with the second region.

5. The device of claim 1, wherein the second region has a length of 10 µm or greater.

6. The device of claim 1, wherein the first region is longer than the second region.

7. The device of claim 1, wherein the graphene layer further includes a third region, and the third region has a resistance higher than the resistance of the first region and includes a side surface of the other end of the graphene layer.

8. The device of claim 7, wherein a concentration of the impurities in the third region is lower than the concentration of the impurities in the first region.

9. The device of claim 1, wherein the graphene layer constitutes an interconnect.

10. The device of claim 1, further comprising another graphene layer which includes two regions corresponding to the first and second regions of the graphene layer respectively, wherein the two regions of the another graphene layer are different in resistances.

11. The device of claim 1, wherein the impurities include at least one of Li, Na, K, Cs, Ca, Sr, Ba, Sm, Eu, Yb, Tm, $F_2$, $Br_2$, ICl, IBr, $MgCl_2$, $AlCl_3$, $FeCl_3$, $CuCl_2$, $SbCl_5$, $MoCl_5$, $AsF_5$, $SbF_5$, $NbF_5$, $HNO_5$, $H_2SO_4$, $H_3PO_4$ and HF.

12. The device of claim 1, wherein the first film comprises an upper portion covering an upper surface of the first region, and a side portion covering another side surface of the graphene layer.

13. The device of claim 12, wherein the second film further covers the upper portion and the side portion of the first film.

14. The device of claim 13, wherein the first plug penetrates the first film and the second film to be in contact with the upper surface of the first region.

* * * * *